United States Patent
Bae et al.

(10) Patent No.: US 11,393,883 B2
(45) Date of Patent: Jul. 19, 2022

(54) DISPLAY PANEL INCLUDING CONDUCTIVE LAYER BETWEEN TFT AND SUBSTRATE, AND A DISPLAY DEVICE INCLUDING DISPLAY PANEL AND SENSOR

(71) Applicant: SAMSUNG DISPLAY CO., LTD., Yongin-si (KR)

(72) Inventors: Injun Bae, Yongin-si (KR); Hyunwook Choi, Yongin-si (KR); Donghwi Kim, Yongin-si (KR); Chulho Kim, Yongin-si (KR); Woori Seo, Yongin-si (KR); Jin Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/752,093

(22) Filed: Jan. 24, 2020

(65) Prior Publication Data
US 2020/0312927 A1    Oct. 1, 2020

(30) Foreign Application Priority Data

Apr. 1, 2019 (KR) .................. 10-2019-0037958

(51) Int. Cl.
*H01L 27/32* (2006.01)
(52) U.S. Cl.
CPC ...... *H01L 27/3234* (2013.01); *H01L 27/3248* (2013.01); *H01L 27/3276* (2013.01)
(58) Field of Classification Search
CPC ............. H01L 27/3234; H01L 27/3248; H01L 27/3276
See application file for complete search history.

(56) References Cited

U.S. PATENT DOCUMENTS

| 5,905,274 A | 5/1999 | Ahn et al. |
| 9,018,631 B2* | 4/2015 | Aichi ................... H01L 27/1214 257/71 |
| 9,306,190 B2 | 4/2016 | Kim et al. |
| 2010/0065851 A1* | 3/2010 | Makita ................ H01L 27/1281 257/72 |

(Continued)

FOREIGN PATENT DOCUMENTS

| KR | 10-0248123 | 3/2000 |
| KR | 10-2016-0021330 | 2/2016 |

(Continued)

OTHER PUBLICATIONS

Williams et al., "Etch Rates for Micromachining Processing", Journal of Microelectromechanical Systems, vol. 5, No. 4, Dec. 1996, pp. 256-269.

*Primary Examiner* — Lex H Malsawma
(74) *Attorney, Agent, or Firm* — F. Chau & Associates, LLC

(57) ABSTRACT

A display panel is provided including a substrate including a display area comprising first pixels and a sensor area including second pixels and a transmission portion. A display element layer is disposed on the substrate, the display element layer comprising the first pixels electrically connected to a first thin film transistor and the second pixels electrically connected to a second thin film transistor. A conductive layer is disposed between the second thin film transistor and the substrate, the conductive layer having two or more steps at an edge thereof.

21 Claims, 14 Drawing Sheets

(56) References Cited

U.S. PATENT DOCUMENTS

| | | | |
|---|---|---|---|
| 2011/0227878 A1* | 9/2011 | Makita | H01L 27/1229 345/175 |
| 2016/0155755 A1* | 6/2016 | Liu | H01L 29/78633 257/72 |
| 2017/0161543 A1* | 6/2017 | Smith | G06K 9/0004 |
| 2017/0371464 A1* | 12/2017 | Nakanishi | G06F 3/0446 |
| 2018/0107241 A1 | 4/2018 | Evans, V et al. | |
| 2018/0129328 A1 | 5/2018 | Park et al. | |
| 2018/0212060 A1 | 7/2018 | Kang et al. | |
| 2019/0130155 A1* | 5/2019 | Park | G09G 3/32 |
| 2019/0296055 A1* | 9/2019 | Lius | H01L 27/124 |
| 2019/0303639 A1* | 10/2019 | He | G06K 9/0004 |
| 2020/0312832 A1* | 10/2020 | Chi | H01L 27/3218 |

FOREIGN PATENT DOCUMENTS

| | | |
|---|---|---|
| KR | 10-2017-0078075 | 7/2017 |
| KR | 10-2018-0050473 | 5/2018 |
| KR | 1020180088099 | 8/2018 |

* cited by examiner

DISPLAY PANEL INCLUDING CONDUCTIVE LAYER BETWEEN TFT AND SUBSTRATE, AND A DISPLAY DEVICE INCLUDING DISPLAY PANEL AND SENSOR

CROSS-REFERENCE TO RELATED APPLICATION

This non-provisional patent application claims priority under 35 U.S.C. § 119 to Korean Patent Application No. 10-2019-0037958, filed on Apr. 1, 2019 in the Korean Intellectual Property Office, the disclosure of which is incorporated by reference herein in its entirety.

TECHNICAL FIELD

The present invention relates to a display panel and a display apparatus including the display panel.

DISCUSSION OF THE RELATED ART

Display apparatuses have been incorporated into various electronic devices, such as smart phones, tablet PCs, etc. Since the thickness and weight of the display apparatuses have been reduced, the range of uses of the display apparatuses has increased.

Different methods of designing a shape of display apparatuses have been developed and more functions have been incorporated into the display apparatuses.

SUMMARY

According to an exemplary embodiment of the present invention, a display panel is provided including a substrate including a display area comprising first pixels and a sensor area including second pixels and a transmission portion. A display element layer is disposed on the substrate, the display element layer comprising the first pixels electrically connected to a first thin film transistor and the second pixels electrically connected to a second thin film transistor. A conductive layer is disposed between the second thin film transistor and the substrate, the conductive layer having two or more steps at an edge thereof.

According to an exemplary embodiment of the present invention, the display element layer further comprises a scan line extending in a first direction. The scan line provides a scan signal to the second pixels, and the conductive layer is electrically connected to the scan line via a contact hole.

According to an exemplary embodiment of the present invention, the display element layer further comprises a driving voltage line extending in a second direction. The driving voltage line applies a driving voltage to the second pixels, and the conductive layer is electrically connected to the driving voltage line via a contact hole.

According to an exemplary embodiment of the present invention, the conductive layer has a thickness of 1500 Å or greater.

According to an exemplary embodiment of the present invention, one of the two or more steps in the conductive layer has a thickness less than 800 Å.

According to an exemplary embodiment of the present invention, the conductive layer comprises a first conductive layer and a second conductive layer on the first conductive layer. The first conductive layer and the second conductive layer include different materials from each other.

According to an exemplary embodiment of the present invention, the first conductive layer comprises a first conductive material and the second conductive layer comprises a second conductive material having an etch rate greater than an etch rate of the first conductive material.

According to an exemplary embodiment of the present invention, a width of the second conductive layer in a first direction is less than a width of the first conductive layer.

According to an exemplary embodiment of the present invention, a thickness of an edge of the conductive layer is less than a thickness of a center portion of the conductive layer.

According to an exemplary embodiment of the present invention, the sensor area comprises an auxiliary pixel area and a transmission area. The auxiliary pixel area has at least one of the second pixels and the transmission area comprising the transmission portion, and the auxiliary pixel area and the transmission area are arranged in a grid shape.

According to an exemplary embodiment of the present invention, the at least one second pixel comprises a pixel electrode, a common electrode, and an intermediate layer, the common electrode facing the pixel electrode and the intermediate layer being arranged between the pixel electrode and the common electrode, and the common electrode comprises an opening corresponding to the transmission area.

According to an exemplary embodiment of the present invention, an image provided on the sensor area has a resolution that is less than a resolution of an image provided on the display area.

According to an exemplary embodiment of the present invention, a display apparatus is provided including a substrate. The substrate includes a display area including first pixels, and a sensor area including second pixels and a transmission portion. A display element layer is disposed on the substrate, the display element layer comprising the first pixels electrically connected to a first thin film transistor and the second pixels electrically connected to a second thin film transistor. A conductive layer is disposed between the second thin film transistor and the substrate, the conductive layer having two or more steps, and a component arranged under the substrate in the sensor area.

According to an exemplary embodiment of the present invention, the component comprises an electronic element for emitting or receiving light.

According to an exemplary embodiment of the present invention, the display element layer further comprises a scan line and a driving voltage line. The scan line extends in a first direction and provides a scan signal to the auxiliary pixels, and the driving voltage line extends in a second direction that intersects with the first direction and applies a driving voltage to the second pixels. The conductive layer is electrically connected to the scan line or the driving voltage line via a contact hole.

According to an exemplary embodiment of the present invention, the conductive layer has a thickness of 1500 Å or greater.

According to an exemplary embodiment of the present invention, the two or more steps in the conductive layer each have a thickness less than 800 Å.

According to an exemplary embodiment of the present invention, the conductive layer comprises a first conductive layer and a second conductive layer on the first conductive layer. The first conductive layer and the second conductive layer include different materials from each other.

According to an exemplary embodiment of the present invention, the first conductive layer includes a first conductive material and the second conductive layer includes a second conductive material having an etch rate greater than an etch rate of the first conductive material.

According to an exemplary embodiment of the present invention, an image provided on the sensor area has a resolution that is less than a resolution of an image provided on the display area.

According to an exemplary embodiment of the present invention, a display panel is provided including a substrate including a display area. A first pixel and a sensor area are disposed in the display area. The sensor area includes a second pixel and a transmission portion. A sensing component overlaps the second pixel and the transmission portion. A light blocking layer is disposed between the sensing component and the second pixel.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
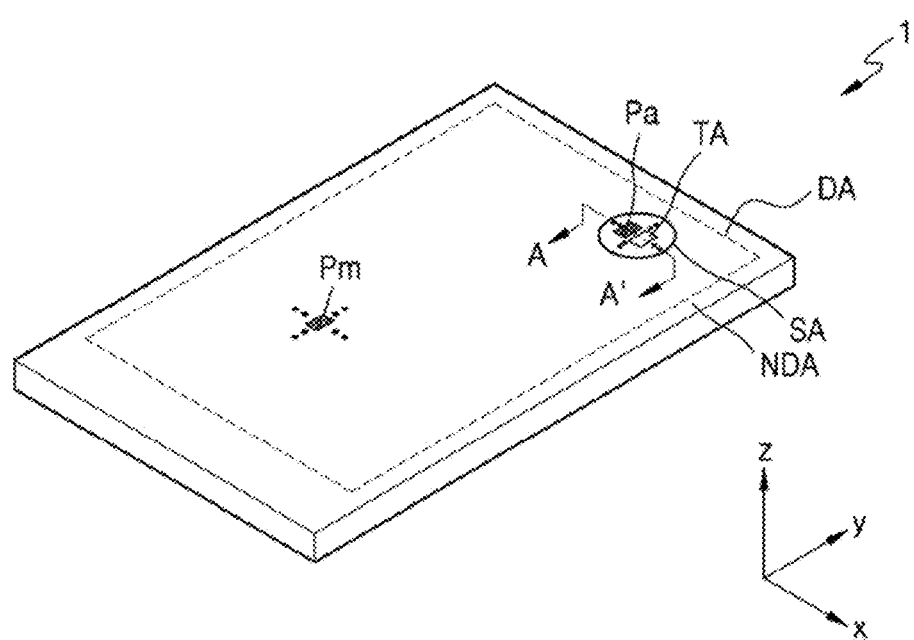
FIG. 1 is a perspective view of a display apparatus according to an exemplary embodiment of the present invention.

Exemplary embodiments of the present invention will now be described with reference to the accompanying drawings. The present invention may, however, be embodied in many different forms and should not be construed as being limited to the embodiments set forth herein. Like reference numerals may refer to like elements throughout the detailed description and drawings.

It will be understood that when a layer, region, or component is referred to as being "formed on" another layer, region, or component, it can be directly or indirectly formed on the other layer, region, or component. For example, intervening layers, regions, or components may be present.

Sizes of components in the drawings may be exaggerated for convenience of explanation.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display apparatus 1 according to an exemplary embodiment of the present invention.

Referring to FIG. 1, the display apparatus 1 includes a display area DA on which images are displayed and a non-display area NDA that does not display images. The display apparatus 1 may provide a main image via light emitted from a plurality of main pixels Pm arranged in the display area DA.

The display apparatus 1 includes a sensor area SA. The sensor area SA may be an area where a component such as a sensor is configured to detect an input using an infrared ray, a visible ray, or sound. The sensor area SA may include a transmission portion TA, through which light and/or sound output incident to or originating from the component are transmitted to the outside. According to an exemplary embodiment of the present invention, when the light transmits through the sensor area SA, a light transmittance may be about 10% or greater. For example, the light transmittance through the sensor area SA may be 20% or greater, 25% or greater, 50% or greater, 85% or greater, or 90% or greater.

According to an exemplary embodiment of the present invention, a plurality of auxiliary pixels Pa may be arranged in the sensor area SA, and a predetermined image may be provided by using light emitted from the plurality of auxiliary pixels Pa. The image provided from the sensor area SA is an auxiliary image having a resolution less than that of an image provided by the main pixels Pm disposed in the display area DA. In other words, the sensor area SA includes the transmission portion TA, through which the light and/or sound may transmit, and thus, the number of auxiliary pixels Pa per unit area may be less than that of the main pixels Pm per unit area in the display area DA.

The sensor area SA may be at least partially surrounded by the display area DA. For example, as shown in FIG. 1, the sensor area SA may be entirely surrounded by the display area DA and disposed therein. According to an exemplary embodiment of the present invention, the sensor area SA may be interspersed at regular intervals throughout the display area DA. For example, sensor areas SA may have a staggered arrangement with respect to portions of the display area DA, or may have an alternating arrangement therewith.

Hereinafter, according to an exemplary embodiment of the present invention, it is considered that the display apparatus 1 is an organic light-emitting display apparatus, but the display apparatus 1 is not limited thereto. For example, the display apparatus 1 may be an inorganic light-emitting display, a quantum dot light-emitting display, etc.

Referring to FIG. 1, the sensor area SA is in a portion (upper right portion) of the display area DA of a rectangular shape, but the present invention is not limited thereto. For example, the display area DA may have a circular shape, an ellipse shape, or a polygonal shape such as a triangle, a pentagon, etc., and a location of the sensor area SA and the number of sensor areas SA may be variously modified.

Figure 2:
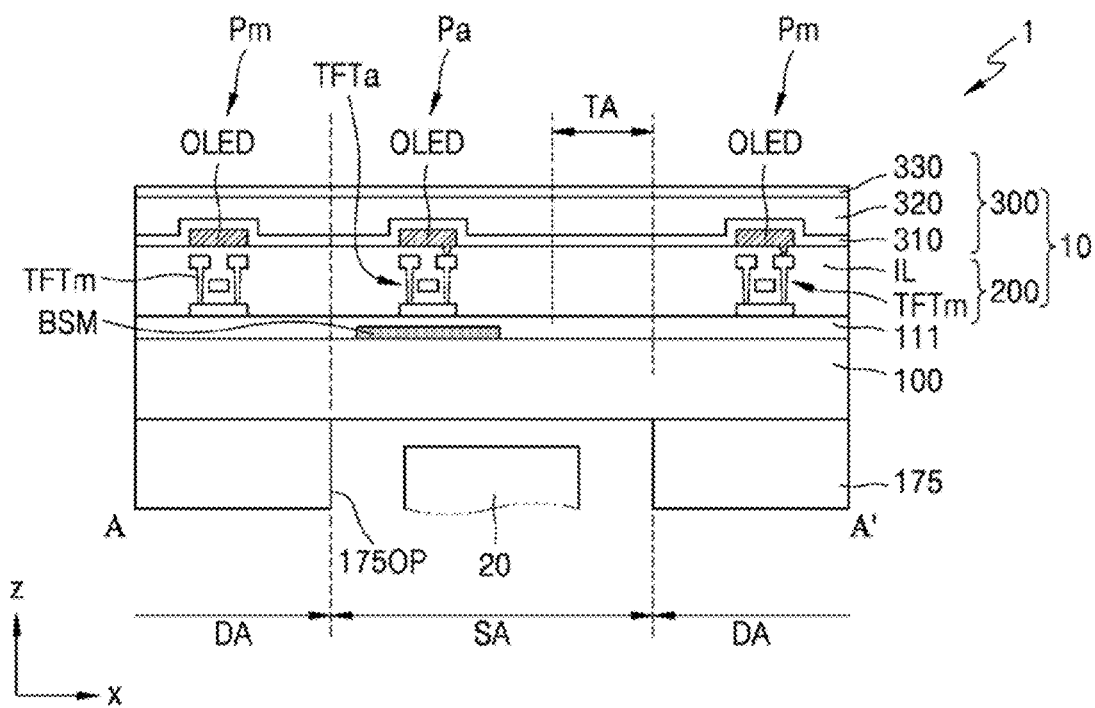
FIG. 2 is a cross-sectional view of the display apparatus taken along line A-A' of FIG. 1 according to an exemplary embodiment of the present invention.

FIG. 2 is a cross-sectional view of the display apparatus 1 according to an exemplary embodiment of the present invention. FIG. 2 shows a cross-section taken along line A-A' of FIG. 1.

Referring to FIG. 2, the display apparatus 1 may include a display panel 10 including display elements, and a component 20 located under the display panel 10 to correspond to the sensor area SA. For example, the component 20 may at least partially overlap the transmission area TA and the organic light-emitting diode OLED in a thickness direction (e.g., a Z direction). However, the present invention is not limited thereto. For example, the component 20 may contact a side wall of an adjacent display area DA, and the organic light-emitting diode OLED of the main pixel Pm may contact an outer boundary of the transmission area TA to increase space efficiency and resolution.

The display panel 10 may include a substrate 100, a buffer layer 111, a display element layer 200 on the substrate 100, and a thin film encapsulation layer 300 that is a sealing member for sealing the display element layer 200. In addition, the display panel 10 may further include a lower protective film 175 arranged under the substrate 100. For example, portions of the lower protective film 175 may be spaced apart from the component 20 in the first direction (e.g., an x direction) and may correspond to the display area DA.

The substrate 100 may include glass and/or a polymer resin. The polymer resin may include polyethersulfone, polyacrylate, polyetherimide, polyethylene naphthalate, polyethylene terephthalate, polyphynylene sulfide, polyarylate, polyimide, polycarbonate and/or cellulose acetate propionate. The substrate 100 including the polymer resin may be flexible, rollable, or bendable. The substrate 100 may have a multi-layered structure including a layer including the polymer resin and/or an inorganic layer.

The display element layer 200 may include a circuit layer including thin film transistors TFTm and TFTa, an organic light-emitting diode OLED that is a display element, and an insulating layer IL between thin film transistors TFT and TFT' and the organic light-emitting diode OLED.

The main pixels Pm each including a main thin film transistor TFTm and an organic light-emitting diode OLED connected to the main thin film transistor TFT are arranged in the display area DA, and the auxiliary pixels Pa each including an auxiliary thin film transistor TFTa and an organic light-emitting diode OLED connected to the auxiliary thin film transistor TFTa and wirings may be arranged in the sensor area SA.

In addition, the transmission portion TA, in which the auxiliary thin film transistor TFTa and display elements are not arranged, may be located in the sensor area SA. The transmission portion TA may be understood as an area, through which light/signals emitted from the component 20 and/or light/signals incident to the component 20 transmit outwardly.

The component 20 may be located in the sensor area SA. The component 20 may be an electronic element using light or sound. For example, the component 20 may be a sensor for receiving light, e.g., an infrared ray sensor, a sensor outputting and sensing light or sound to measure a distance or to sense fingerprints, etc., a small-sized lamp emitting light, or a speaker outputting sound. The electronic element using light may use light of various wavelength bands such as visible light, IR, ultraviolet (UV) ray, etc. A plurality of components 20 may be arranged in the sensor area SA. For example, a light-emitting device and a light-receiving device may be provided in one sensor area SA as the components 20. Alternatively, one component 20 may include a light-emitting portion and a light-receiving portion.

According to an exemplary embodiment of the present invention, a layer BSM may refer to a conductive layer, a sound blocking layer, and/or a light blocking layer. For convenience of description, exemplary embodiments will be described hereafter including a conductive layer BSM. The conductive layer BSM may be arranged in the sensor area SA. The conductive layer BSM may correspond to the auxiliary pixels Pa in the sensor area SA. For example, the conductive layer BSM may be arranged corresponding to a lower portion of the auxiliary thin film transistor TFTa. The conductive layer BSM may prevent external light emitted from the component 20 from reaching the auxiliary pixel Pa including the auxiliary thin film transistor TFTa.

According to an exemplary embodiment of the present invention, a constant voltage or a signal is applied to the conductive layer BSM to prevent damage to a pixel circuit due to an electrostatic discharge. The conductive layer BSM may electrically contact the wiring that is connected to the auxiliary pixel Pa to apply electric power or signals thereto, so that a constant voltage or a signal may be applied to the conductive layer BSM. For example, the conductive layer BSM may receive a ground voltage or a predetermined voltage of the auxiliary pixel Pa. For example, the conductive layer BSM may receive a voltage or signal from a scan line or a driving voltage line, but the present invention is not limited thereto.

The thin film encapsulation layer 300 may include at least one inorganic encapsulation layer and at least one organic encapsulation layer. In this regard, referring to FIG. 2, the thin film encapsulation layer 300 may include first and second inorganic encapsulation layers 310 and 330, respectively, and an organic encapsulation layer 320 between the first and second inorganic encapsulation layers 310 and 330.

The first and second inorganic encapsulation layers 310 and 330 may include one or more inorganic insulating materials such as aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, hexamethyl disiloxane and/or an acryl-based resin (e.g., polymethyl methacrylate, polyacrylic acid, etc.).

The lower protective film 175 is attached to a lower portion of the substrate 100 and may protect and support the substrate 100. The lower protective film 175 may include an opening 1750P corresponding to the sensor area SA. Since the lower protective film 175 includes the opening 1750P, a light transmittance of the sensor area SA may be increased. The lower protective film 175 may include polyethyelene terepthalate and/or polyimide.

A width of the sensor area SA in the first direction (e.g., the x direction) may be greater than a width of the component 20 in the first direction (e.g., the x direction). In FIG. 2, the width of the sensor area SA is equal to the width of the opening 1750P, but the width of the opening 1750P in the lower protective film 175 may not be equal to that of the sensor area SA. For example, the width of the opening 1750P may be less than the width of the sensor area SA.

Components such as an input sensing member for sensing a touch input, an anti-reflection member including a polarizer and a retarder, or a color filter and a black matrix, a transparent window, etc. may be further arranged on the display panel 10.

The thin film encapsulation layer 300 may also be referred to herein as an encapsulation member 300 for sealing the display element layer 200. For example, an encapsulation substrate that is bonded to the substrate 100 via a sealant or a frit may be used as the encapsulation member 300 for the display element layer 200.

According to an exemplary embodiment of the present invention, the sensor area SA may include two auxiliary pixels Pa and a transmission portion TA disposed between the two auxiliary pixels Pa, when viewed in a cross-sectional view.

According to an exemplary embodiment of the present invention, the auxiliary pixel Pa may be disposed between two transmission areas TA, when viewed in a cross-sectional view.

According to an exemplary embodiment of the present invention, the sensor areas SA may be disposed in rows and/or columns. In such an embodiment, the auxiliary pixel PA may be slightly larger relative to a main pixel Pm to reduce a size of a non-transmittance region of the sensor area SA. For example, the auxiliary pixel Pa may contact the transmission area TA or may partially overlap the transmission area TA. The component(s) 20 may individually or collectively extend in the second direction (e.g., a y direction). The component(s) 20 may have a width in the first direction (e.g., the x direction) that substantially corresponds to a width of the transmission area TA in the first direction (e.g., the x direction).

According to an exemplary embodiment of the present invention, the transmission area TA may have an annular shape in a plane defined by the first direction (e.g., the x direction) and the second direction (e.g., the y direction) with the auxiliary pixel Pa disposed at its center. In this embodiment, the component 20 may be annular or a solid circle shape of substantially the same diameter as the transmission area TA and overlapping therewith. The conductive layer BSM may have a circular shape with a smaller diameter than the transmission area TA and the conductive layer BSM.

According to an exemplary embodiment of the present invention, the component 20 may be disposed as a layer on the substrate 100 below the auxiliary pixels Pm and the conductive layer BSM, and substantially all pixels of the display apparatus 1 may be auxiliary pixels Pa. In such a case, the transmission area TA may be disposed between adjacent auxiliary pixels Pa.

Figure 3:
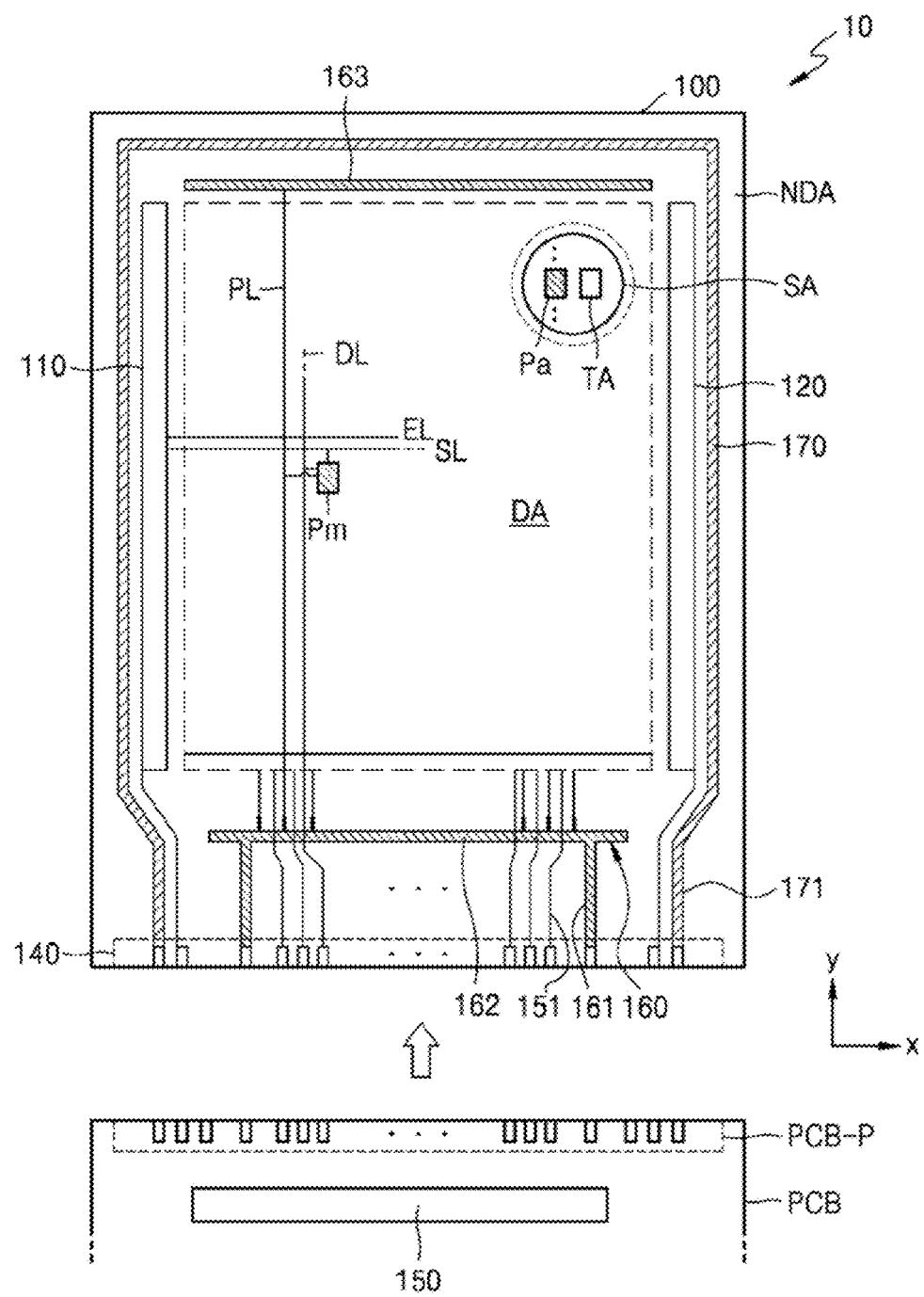
FIG. 3 is a plan view of a display panel according to an exemplary embodiment of the present invention.
Figure 4:
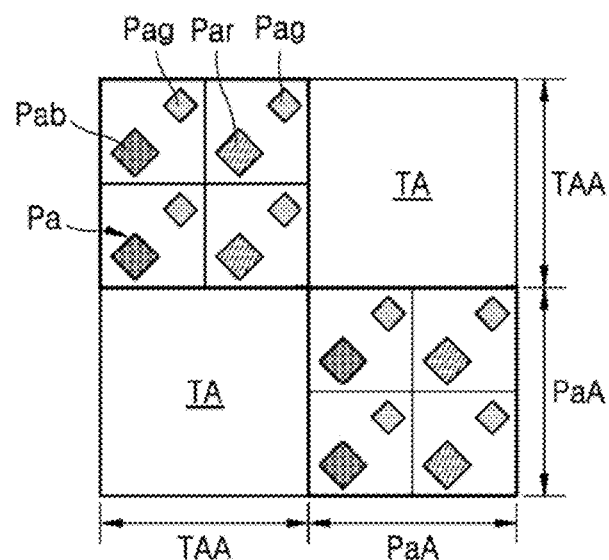
FIG. 4 is a plan view showing an enlarged view of a sensor area SA of FIG. 3 according to an exemplary embodiment of the present invention.

FIG. 3 is a plan view of the display panel 10 according to an exemplary embodiment of the present invention, and FIG. 4 is a plan view showing an enlarged view of the sensor area SA of FIG. 3 according to an exemplary embodiment of the present invention.

Referring to FIG. 3, the display panel 10 is arranged in the display area DA and includes the plurality of main pixels Pm. Each of the main pixels Pm may include a display element such as an organic light-emitting diode OLED. Each of the main pixels Pm may emit light, e.g., red light, green light, blue light, or white light, via the organic light-emitting diode OLED. The main pixel Pm may be understood as a pixel emitting red light, green light, blue light, or white light, as described above. The display area DA is covered by the encapsulation member 300 described above with reference to FIG. 2, so as to be protected against external air or moisture.

The sensor area SA may be arranged in the display area DA and the plurality of auxiliary pixels Pa are arranged in the sensor area SA. Each of the auxiliary pixels Pa may include a display element such as an organic light-emitting diode. Each of the auxiliary pixels Pa may emit light, e.g., red light, green light, blue light, or white light, via the organic light-emitting diode. The auxiliary pixel Pa may be understood as a pixel emitting red light, green light, blue light, or white light, as described above. In addition, the sensor area SA includes the transmission portion TA between adjacent auxiliary pixels Pa.

The sensor area SA includes the transmission portion TA, and thus a resolution of the sensor area SA may be less than that of the display area DA. For example, the resolution of the sensor area SA may be half the resolution of the remainder of the display area DA. According to an exemplary embodiment of the present invention, the resolution of the display area DA may be 400 PPI or greater, and the resolution of the sensor area SA may be about 200 PPI or greater.

Referring to FIG. 4, the sensor area SA may include an auxiliary pixel area PaA including at least one auxiliary pixel Pa, and a transmission area TAA including the transmission portion TA. The auxiliary pixel area PaA and the transmission area TAA may be arranged in a grid shape.

According to an exemplary embodiment of the present invention, the auxiliary pixel area PaA may include a first auxiliary pixel Par emitting red light, a second auxiliary pixel Pag emitting green light, and a third auxiliary pixel Pab emitting blue light. FIG. 4 shows the auxiliary pixels Pa of a Pentile type, but the auxiliary pixels Pa may be formed in a stripe pattern. Also, in FIG. 4, eight auxiliary pixels Pa are included in the auxiliary pixel area PaA, but the number of auxiliary pixels Pa may vary depending on a resolution of the sensor area SA.

According to an exemplary embodiment of the present invention, one main pixel Pm and one auxiliary pixel Pa may include the same pixel circuits. However, the present invention is not limited thereto. In other words, the pixel circuit included in the main pixel Pm and the pixel circuit included in the auxiliary pixel Pa may be different from each other.

Referring to FIG. 3, each of the main and auxiliary pixels Pm and Pa may be electrically connected to components arranged in the non-display area NDA. For example, in the non-display area NDA, a first scan driving circuit 110, a second scan driving circuit 120, a terminal 140, a data driving circuit 150, a first power supply line 160, and a second power supply line 170 may be arranged.

The first scan driving circuit 110 may provide each pixel Pm or Pa with a scan signal via a scan line SL. The first scan driving circuit 110 may provide each pixel Pm or Pa with an emission control signal via an emission control line EL. The second scan driving circuit 120 may be arranged in parallel with the first scan driving circuit 110; with the display area DA arranged therebetween. Some of the pixels Pm and Pa arranged in the display area DA may be electrically connected to the first scan driving circuit 110, and the other pixels may be connected to the second scan driving circuit 120. According to an exemplary embodiment of the present invention, the second scan driving circuit 120 may be omitted.

The terminal 140 may be arranged at a side of the substrate 100. The terminal 140 may not be covered by an insulating layer but is exposed, and may be electrically connected to a printed circuit board PCB. A terminal PCB-P of the printed circuit board PCB may be electrically connected to the terminal 140 of the display panel 10. The printed circuit board PCB may transfer a signal or power of a controller to the display panel 10. A control signal generated by the controller may be respectively transferred to the first and second scan driving circuits 110 and 120 via the printed circuit board PCB. The controller may provide the first and second power supply lines 160 and 170 respectively with a first power voltage ELVDD and a second power voltage ELVSS (see FIG. 5 and FIG. 6) via first and second connecting lines 161 and 171. The first power voltage ELVDD is supplied to each main pixel Pm or auxiliary pixel Pm via a driving voltage line PL connected to the first power supply line 160, and the second power voltage ELVSS may be provided to an opposite electrode of each pixel Pm or Pa connected to the second power supply line 170.

The data driving circuit 150 is electrically connected to a data line DL. A data signal of the data driving circuit 150 may be provided to each of the pixels Pm and Pa via a connecting line 151 connected to the terminal 140 and the data line DL connected to the connecting line 151. Although FIG. 3 shows that the data driving circuit 150 is arranged on the printed circuit board PCB, the data driving circuit 150 may be arranged on the substrate 100 according to an exemplary embodiment of the present invention. For example, the data driving circuit 150 may be arranged between the terminal 140 and the first power supply line 160.

The first power supply line 160 may include a first sub-line 162 and a second sub-line 163 that extend in parallel with each other in the first direction (e.g., the X-direction) with the display area DA therebetween. The second power supply line 170 has a loop shape having an open side to partially surround the display area DA.

Figure 5:
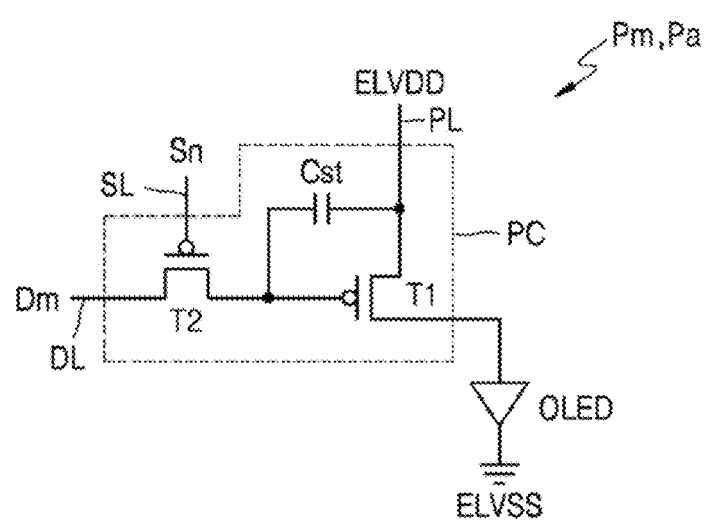
FIG. 5 is an equivalent circuit diagram of a pixel according to an exemplary embodiment of the present invention.
Figure 6:
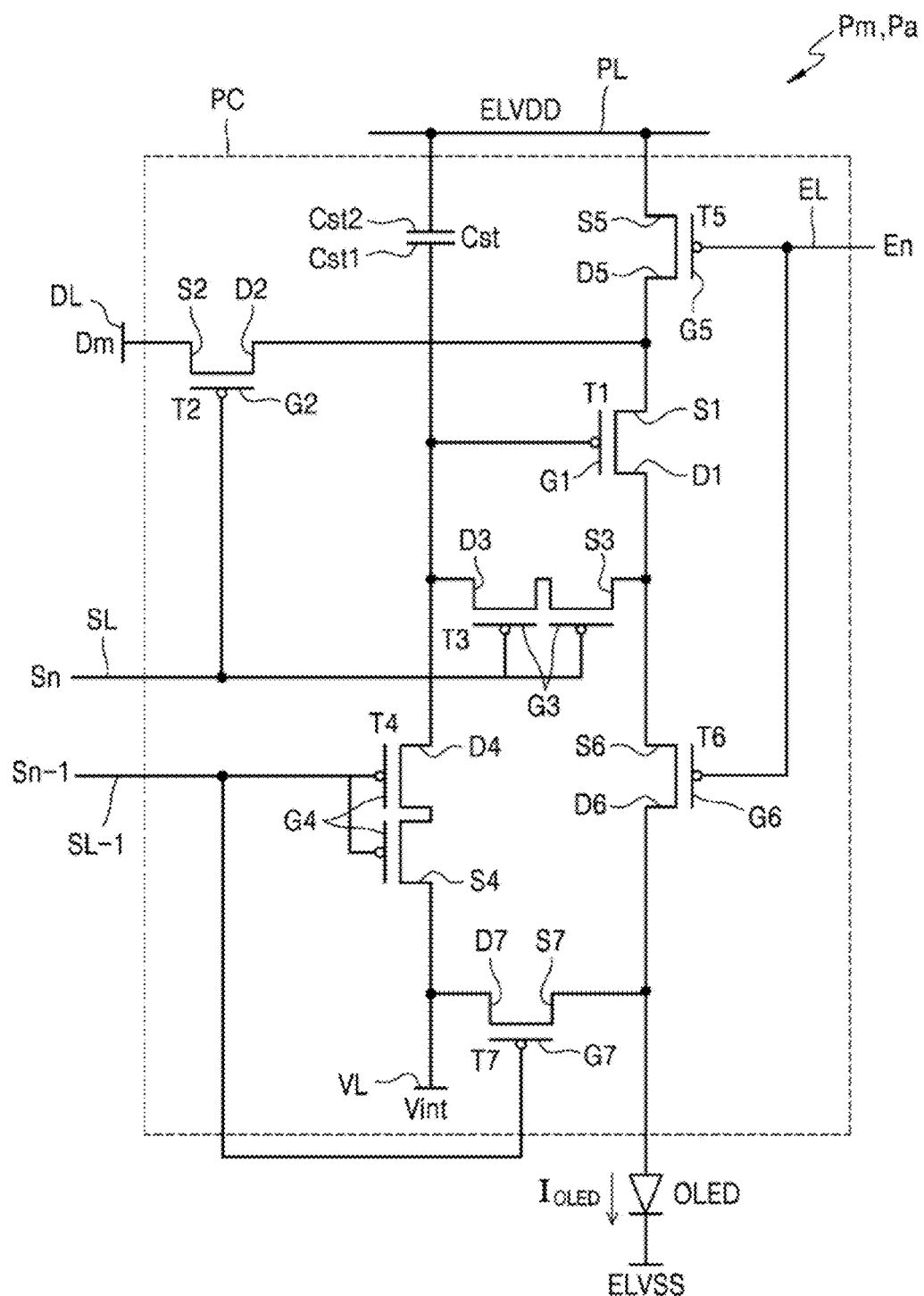
FIG. 6 is an equivalent circuit diagram of a pixel according to an exemplary embodiment of the present invention.

FIG. 5 is an equivalent circuit diagram of a pixel according to an exemplary embodiment of the present invention, and FIG. 6 is an equivalent circuit diagram of a pixel according to an exemplary embodiment of the present invention.

The equivalent circuit diagram of FIG. 5 or FIG. 6 may be applied to the main pixel Pm and/or the auxiliary pixel Pa.

Referring to FIG. 5, each of the main and auxiliary pixels Pm and Pa may include a pixel circuit PC connected to the scan line SL and the data line DL and an organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm input through the data line DL to the driving thin film transistor T1 according to a scan signal Sn input through the scan line SL.

The storage capacitor Cst is connected to the switching thin film transistor T2 and a driving voltage line PL and stores a voltage corresponding to a difference between a voltage transferred from the switching thin film transistor T2 and the first power voltage ELVDD (or driving voltage) supplied to the driving voltage line PL.

The driving thin film transistor T1 is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a predetermined luminance according to the driving current.

FIG. 5 shows an example in which the pixel circuit PC includes two thin film transistors and one storage capacitor, but the present invention is not limited thereto. As shown in FIG. 6, the pixel circuit PC may include seven thin film transistors and one storage capacitor.

Referring to FIG. 6, each of the main and auxiliary pixels Pm and Pa includes a pixel circuit PC and an organic light-emitting diode OLED connected to the pixel circuit PC. The pixel circuit PC may include a plurality of thin film transistors and a storage capacitor. The thin film transistors and the storage capacitor may be connected to signal lines SL, SL−1, EL, and DL, an initialization voltage line VL, and a driving voltage line PL.

In FIG. 6, each pixel Pm or Pa is connected to the signal lines SL, SL−1, EL, and DL, the initialization voltage line VL, and the driving voltage line PL, but one or more embodiments are not limited thereto. As another embodiment, at least one of the signal lines SL, SL−1, EL, and DL, the initialization voltage line VL, and the driving voltage line PL may be shared by neighboring pixels P.

The plurality of thin film transistors may include a driving TFT T1, a switching TFT T2, a compensation TFT T3, a first initialization TFT T4, an operation control TFT T5, an emission control TFT T6, and a second initialization TFT T7.

The signal lines include the scan line SL transferring a scan signal Sn, a previous scan line SL−1 transferring a previous scan signal Sn−1 to the first initialization TFT T4 and the second initialization TFT T7, an emission control line EL transferring an emission control signal En to the operation control TFT T5 and the emission control TFT T6, and a data line DL intersecting with the scan line SL and transferring a data signal Dm. The driving voltage line PL transfers the driving voltage ELVDD to the driving TFT T1, and the initialization voltage line VL transfers an initialization voltage Vint for initializing the driving TFT T1 and the pixel electrode.

A driving gate electrode G1 of the driving TFT T1 is connected to a first storage capacitor plate Cst1 of the storage capacitor Cst, a driving source electrode S1 of the driving TFT T1 is connected to the driving voltage line PL via the operation control TFT T5, and a driving drain electrode D1 of the driving TFT T1 is electrically connected to the pixel electrode of the organic light-emitting diode OLED via the emission control TFT T6. The driving TFT T1 receives the data signal Dm according to a switching operation of the switching TFT T2 to supply a driving current $I_{OLED}$ to a main organic light-emitting diode OLED.

A switching gate electrode G2 of the switching TFT T2 is connected to the scan line SL, a switching source electrode S2 of the switching TFT T2 is connected to the data line DL, a switching drain electrode D2 of the switching TFT T2 is connected to the driving source electrode S1 of the driving TFT T1 and at the same time, is connected to the driving voltage line PL via the operation control TFT T5. The switching TFT T2 is turned on according to the scan signal Sn received through the scan line SL and performs a switching operation that transfers the data signal Dm transferred through the data line DL to the driving source electrode S1 of the driving TFT T1.

A compensation gate electrode G3 of the compensation TFT T3 is connected to the scan line SL, a compensation source electrode S3 of the compensation TFT T3 is connected to the driving drain electrode D1 of the driving TFT T1 and at the same time is connected to the pixel electrode of the organic light-emitting diode OLED via the emission control TFT T6, and a compensation drain electrode D3 of the compensation TFT T3 is connected to the first storage capacitor plate Cst1 of the storage capacitor Cst, a first initialization drain electrode D4 of the first initialization TFT T4, and the driving gate electrode G1 of the driving TFT T1. The compensation TFT T3 is turned on according to the scan signal Sn received through the scan line SL to electrically connect the driving gate electrode G1 and the driving drain electrode D1 of the driving TFT T1 to each other and to diode-connect the driving TFT T1.

A first initialization gate electrode G4 of the first initialization TFT T4 is connected to the previous scan line SL−1, a first initialization source electrode S4 of the first initialization TFT T4 is connected to a second initialization drain electrode D7 of the second initialization TFT T7 and the initialization voltage line VL, and the first initialization drain electrode D4 of the first initialization TFT T4 is connected to the first storage capacitor plate Cst1 of the storage capacitor Cst, the compensation drain electrode D3 of the compensation TFT T3, and the driving gate electrode G1 of the driving TFT T1. The first initialization TFT T4 is turned on according to a previous scan signal Sn−1 transferred through the previous scan line SL−1 to transfer the initialization voltage Vint to the driving gate electrode G1 of the driving TFT T1 and perform an initialization operation for initializing a voltage at the driving gate electrode G1 of the driving TFT T1.

An operation control gate electrode G5 of the operation control TFT T5 is connected to the emission control line EL, an operation control source electrode S5 of the operation control TFT T5 is connected to the driving voltage line PL, and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line EL, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to a second initialization source electrode S7 of the second initialization TFT T7 and the pixel electrode of the organic light-emitting diode OLED.

The operation control TFT T5 and the emission control TFT T6 are simultaneously turned on according to the emission control signal En transferred through the emission control line EL to transfer the driving voltage ELVDD to the main organic light-emitting diode OLED and to allow a driving current $I_{OLED}$ to flow in the organic light-emitting diode OLED.

The second initialization gate electrode G7 of the second initialization TFT T7 is connected to the previous scan line SL−1, a second initialization source electrode S7 of the second initialization TFT T7 is connected to the emission control drain electrode D6 of the emission control TFT T6 and the pixel electrode of the main organic light-emitting diode OLED, and a second initialization drain electrode D7 of the second initialization TFT T7 is connected to the first initialization source electrode S4 of the first initialization TFT T4 and the initialization voltage line VL. The second initialization TFT T7 is turned on according to the previous scan signal Sn−1 transferred through the previous scan line SL−1 to initialize the pixel electrode of the main organic light-emitting diode OLED.

In FIG. 6, the first initialization TFT T4 and the second initialization TFT T7 are connected to the previous scan line SL−1, but the a pixel circuit according to the present invention is not limited thereto. According to an exemplary embodiment of the present invention, the first initialization TFT T4 may be connected to the previous scan line SL−1 to operate according to the previous scan signal Sn−1, and the second initialization TFT T7 may be connected to a separate signal line (e.g., a post scan line) to operate according to a signal transferred to the signal line.

A second storage capacitor plate Cst2 of the storage capacitor Cst is connected to the driving voltage line PL, and an opposite electrode of the organic light-emitting diode OLED is connected to the common voltage (i.e., second power voltage) ELVSS. Accordingly, the organic light-emitting diode OLED emits light by receiving the driving current $I_{OLED}$ from the driving TFT T1 to display images.

In FIG. 6, the compensation TFT T3 and the first initialization TFT T4 have dual-gate electrodes, but the compensation TFT T3 and the first initialization TFT T4 may each have one gate electrode.

According to an exemplary embodiment of the present invention, the main pixel Pm and the auxiliary pixel Pa may include same pixel circuits PC. However, the present invention is not limited thereto. The main pixel Pm and the auxiliary pixel Pa may have pixel circuits PC having different structures from each other. For example, the main pixel Pm may adopt the pixel circuit shown in FIG. 6, and the auxiliary pixel Pa may adopt the pixel circuit shown in FIG. 5.

Figure 7:
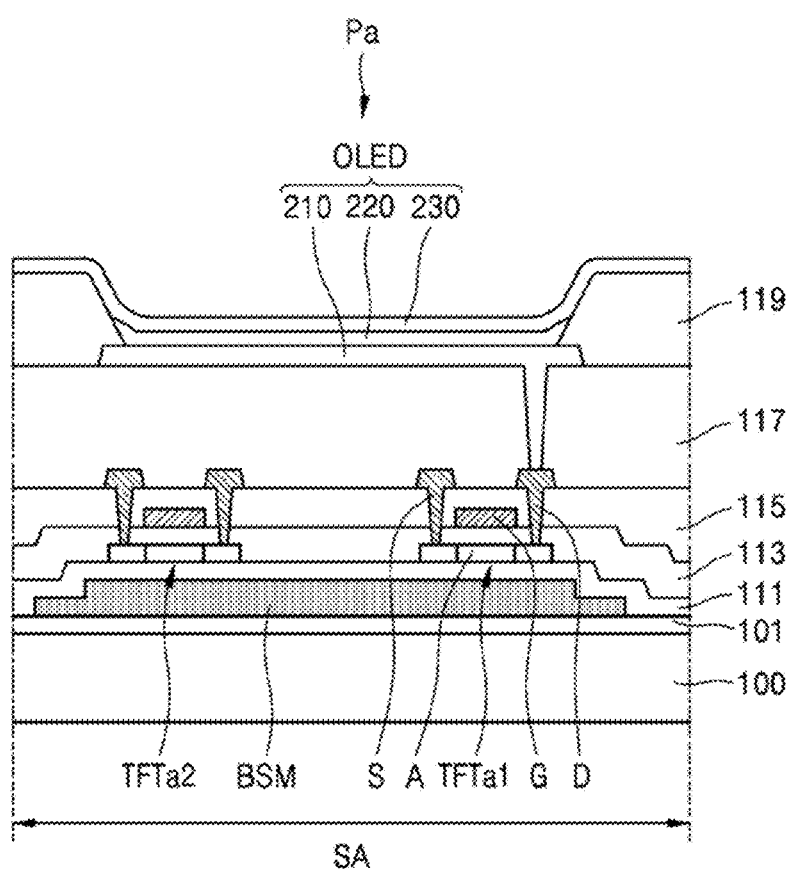
FIG. 7 is a cross-sectional view of a display panel according to an exemplary embodiment of the present invention.

FIG. 7 is a cross-sectional view showing a display panel according to an exemplary embodiment of the present invention. FIG. 7 is a cross-sectional view of an auxiliary pixel Pa of a sensor area SA.

The auxiliary pixels Pa and the transmission portion TA may be located in the sensor area SA. Hereinafter, one pixel structure will be described based on the auxiliary pixel Pa, but the same structure may be also applied to the main pixel Pm.

The substrate 100 may include glass and/or a polymer resin. The polymer resin may include a polyethersulfone, polyacrylate, polyetherimide, polyethylene naphthalate, polyethylene terephthalate, polyphynylene sulfide, polyarylate, polyimide, polycarbonate, cellulose acetate propionate, etc. The substrate 100 including the polymer resin may be flexible, rollable, or bendable. The substrate 100 may have a multi-layered structure including a layer including the polymer resin and an inorganic layer.

A buffer layer 111 and a barrier layer 101 are located on the substrate 100 to reduce or block infiltration of impurities, moisture, or external air from a lower portion of the substrate 100, and to provide a flat surface on the substrate 100. The buffer layer 111 and the barrier layer 101 may include an inorganic material such as an oxide material, a nitride material, an organic material, and/or an inorganic-organic composite material, and may have a single-layered or multi-layered structure including the inorganic material and the organic material. Referring to FIGS. 7 to 15, the conductive layer BSM may be arranged between the barrier layer 101 and the buffer layer 111. In an exemplary embodiment of the present invention, the buffer layer 111 may be omitted and the conductive layer BSM may be arranged on the substrate 100 directly.

Auxiliary thin film transistors TFTa and TFTa2 may be arranged on the buffer layer 111. In FIG. 7, the auxiliary pixel Pa includes two auxiliary thin film transistors TFTa1 and TFTa2, but may include three or more auxiliary thin film transistors.

A semiconductor layer A may be arranged on the buffer layer 111. The semiconductor layer A may include, for example, amorphous silicon. According to an exemplary embodiment of the present invention, the semiconductor layer A may include an oxide semiconductor including indium (In), gallium (Ga), stannum (Sn), zirconium (Zr), vanadium (V), hafnium (Hf), cadmium (Cd), germanium (Ge), chrome (Cr), titanium (Ti), and/or zinc (Zn). For example, the semiconductor layer A may include an oxide semiconductor such as indium gallium zinc oxide (IGZO), zinc tin oxide (ZTO), and/or zinc indium oxide (ZIO).

The gate electrode G is arranged on the semiconductor layer A with a gate insulating layer 113 therebetween. The gate electrode G may include molybdenum (Mo), aluminum (Al), copper (Cu), and/or titanium (Ti), and may have a single-layered or multi-layered structure. As an example, the gate electrode G may include a single layer including Mo.

The gate insulating layer 113 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A source electrode S and/or a drain electrode D are arranged on the gate electrode G with an interlayer insulating layer 115 therebetween. The source electrode S and/or the drain electrode D include Mo, Al, Cu, and/or Ti, and may each have a single-layered or a multi-layered structure. For example, the source electrode S and/or the drain electrode D may each have a multi-layered structure including Ti/Al/Ti.

The planarization layer 117 covers an upper surface of the source electrode S and/or the drain electrode D, and may have a flat upper surface for planarizing a pixel electrode 210. The planarization layer 117 may include a single-layered or multi-layered structure including an organic material. The planarization layer 117 may include benzocyclobutene (BCB), polyimide, hexamethyldisiloxane (HMDSO), polymethylmethacrylate (PMMA), polystyrene (PS), polymer derivatives having phenol groups, an acryl-based polymer, an imide-based polymer, an aryl ether-based polymer, an amide-based polymer, a fluoride-based polymer, a p-xylene-based polymer, and/or a vinyl alcohol-based polymer. The planarization layer 117 may include an inorganic material. The planarization layer 117 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). When the planarization layer 117 includes the inorganic material, chemical planarization polishing may be performed if necessary. Alternatively, the planarization layer 117 may include both an organic material and an inorganic material.

The pixel electrode 210 may include a semi-transmissive electrode or a reflective electrode. According to an exemplary embodiment of the present invention, the pixel electrode 210 may include a reflective layer including Ag, Mg, Al, Pt, Pd, Au, Ni, Nd, Ir, and/or Cr, and a transparent or semi-transparent electrode layer on the reflective layer. The transparent or semi-transparent electrode layer may include indium tin oxide (ITO), indium zinc oxide (IZO), zinc oxide (ZnO), indium oxide ($In_2O_3$), indium gallium oxide (IGZO), and aluminum zinc oxide (AZO). According to an exemplary embodiment of the present invention, the pixel electrode 210 may include a stack structure including ITO/Ag/ITO.

A pixel defining layer 119 may be located on the planarization layer 117, and the pixel defining layer 119 includes an opening exposing a center portion of the pixel electrode 210 to define a light emitting region of the pixel. Also, the pixel defining layer 119 increases a distance between an edge of the pixel electrode 210 and an opposite electrode 230 on the pixel electrode 210 to prevent generation of arc at the edge of the pixel electrode 210. The pixel defining layer 119 may include an organic insulating material such as polyimide, polyamide, an acrylic resin, BCB, HMDSO, and/or a phenol resin, and may be formed by a process such as spin coating.

The intermediate layer 220 of the organic light-emitting diode OLED may include an organic light-emitting layer. The organic light-emitting layer may include an organic material including a fluorescent or phosphor material emitting red, green, blue, or white light. The organic light-emitting layer may include a low-molecular weight organic material and/or a polymer organic material, and functional layers such as a hole transport layer (HTL), a hole injection layer (HIL), an electron transport layer (ETL), and an electron injection layer (EIL) may be selectively arranged under and on the organic light-emitting layer. The intermediate layer 220 may correspond to each of the plurality of pixel electrodes 210. However, exemplary embodiments of the present invention are not limited thereto. The intermediate layer 220 may be variously modified. In other words, the intermediate layer 220 may be arranged throughout the plurality of pixel electrodes 210.

The opposite electrode 230 may include a transmissive electrode or a reflective electrode. According to an exemplary embodiment of the present invention, the opposite electrode 230 may include a transparent or a semi-transparent electrode, and may be provided as a metal thin film including Li, Ca, LiF/Ca, LiF/Al, Al, Ag, and/or Mg. Also, a transparent conductive oxide (TCO) such as ITO, IZO, ZnO, and/or $In_2O_3$ may be further provided over the metal thin film. The opposite electrode 230 is arranged throughout the display area DA and a peripheral area PA, and on the intermediate layer 220 and the pixel defining layer 119. The opposite electrode 230 may be provided integrally with respect to the plurality of organic light-emitting diodes OLED to correspond to the plurality of pixel electrodes 210.

When the pixel electrode 210 is a reflective electrode and the opposite electrode 230 is a transmissive electrode, light emitted from the intermediate layer 220 is emitted towards the opposite electrode 230 and the display apparatus is a top emission type. When the pixel electrode 210 is a transparent or a semi-transparent electrode and the opposite electrode 230 is a reflective electrode, the light emitted from the intermediate layer 220 is discharged towards the substrate 100 and the display apparatus may be a bottom emission type. However, exemplary embodiments of the present invention are not limited thereto. The display apparatus according to an exemplary embodiment of the present invention may be a dual-emission type in which light is emitted to the top and bottom surfaces thereof.

The above pixel structure may be applied to both the main pixel Pm and the auxiliary pixel Pa.

In addition, the conductive layer BSM may be arranged under the auxiliary pixel Pa. The conductive layer BSM may be arranged between the semiconductor layer A of the auxiliary thin film transistor TFTa and the substrate 100. The conductive layer BSM may overlap an entire lower surface of the auxiliary pixel Pa, or may be patterned to overlap the semiconductor layer A of the auxiliary thin film transistor TFTa. The conductive layer BSM may prevent external light emitted from the component 20 from reaching the auxiliary pixel Pa. For example, an upper step of the conductive layer BSM may overlap the auxiliary thin film transistors TFTa1 and TFTa2 in a thickness direction (e.g., the Z direction).

In addition, a predetermined constant voltage or a signal may be applied to the conductive layer BSM. This will be described in detail below with reference to FIGS. 12 and 13.

The conductive layer BSM may be provided to have two or more steps at an edge thereof. The steps of the conductive layer BSM may be formed as a stair shape. As such, the edge of the conductive layer BSM may have a smaller thickness than that of a center portion of the conductive layer BSM. According to an exemplary embodiment of the present invention, the conductive layer BSM may have a lower step that extends beyond a trench defined by the pixel defining layer 119 and the upper step of the conductive layer BSM may correspond to a width of the pixel electrode 210 of the light emitting region of the organic light-emitting diode OLED.

According to an exemplary embodiment of the present invention, the conductive layer BSM has to have a predetermined thickness or greater in order to block the light emitted from the component 20 (see FIG. 2). In an experimental example, when light having a wavelength of 940 nm was irradiated to a conductive layer BSM including Mo, a light transmittance was about 8% in a case where the thickness of the conductive layer BSM is about 300 Å, about 3% in a case where the thickness of the conductive layer BSM was about 500 Å, about 1% in a case where the thickness of the conductive layer BSM was about 800 Å, and 0% in a case where the thickness of the conductive layer BSM was about 1500 Å or greater. Thus, the conductive layer BSM is to have a thickness of about 1500 Å or greater in order to completely block the light emitted from the component 20.

However, in another experimental example, when the conductive layer BSM had a thickness of about 800 Å or greater, cracks occurred in the inorganic layer and the semiconductor layer A of the auxiliary thin film transistor TFTa1 on the conductive layer BSM due to the step, and defects such as disconnection occurred.

Thus, in the display panel 10 according to an exemplary embodiment of the present invention, the conductive layer BSM having two or more steps at the edge thereof greatly reduces the occurrence of cracks and disconnection defects. This will be described in detail below with reference to FIGS. 8 to 11.

Figure 8:
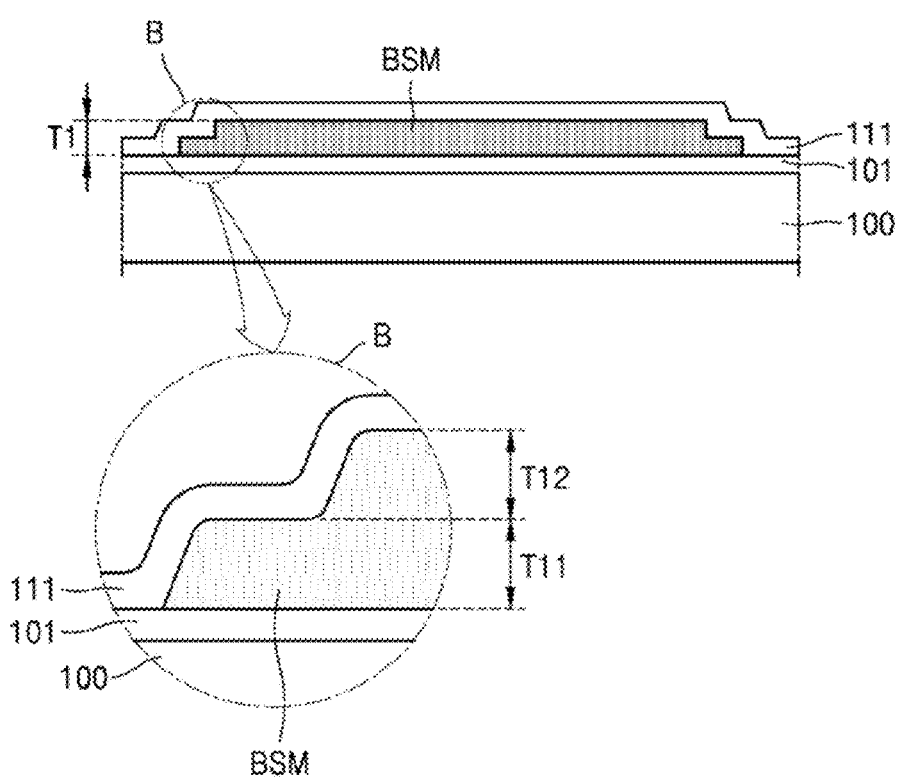
FIGS. 8, 9, 10 and 11 are cross-sectional views of display panels according to exemplary embodiments of the present invention.

FIGS. 8 to 11 are cross-sectional views showing display panels including the conductive layer BSM according to exemplary embodiments of the present invention. Referring to FIG. 8, the conductive layer BSM may be between the substrate 100 and the buffer layer 111. According to an exemplary embodiment of the present invention, an organic layer or an inorganic layer in addition to the buffer layer 111 may be further arranged on the conductive layer BSM. As shown in FIG. 7, the semiconductor layer A of the thin film transistor may be arranged on the buffer layer 111.

The conductive layer BSM may include aluminum (Al), platinum (Pt), palladium (Pd), silver (Ag), magnesium (Mg), glass, manganese (Mn), gold (Au), nickel (Ni), neodymium (Nd), iridium (Ir), chrome (Cr), lithium (Li), calcium (Ca), molybdenum (Mo), titanium (Ti), tungsten (W), and/or copper (Cu). The conductive layer BSM may have a single-layered or a multi-layered structure including the above-stated materials. According to an exemplary embodiment of the present invention, the conductive layer BSM may include a Mo layer. According to an exemplary embodiment of the present invention, when the component 20 is an infrared sensor, an area defined between upper steps of the conductive layer BSM (corresponding to thickness T12) may include a material that absorbs external visible light, and an area defined between lower steps of the conductive layer BSM (corresponding to thickness T11) may include an infrared absorbent material.

A thickness T1 of the conductive layer BSM may be about 800 Å or greater, for example, about 1500 Å or greater. According to an exemplary embodiment of the present invention, the thickness T1 of the conductive layer BSM may be about 2000 Å or greater, about 2500 Å or greater, about 3000 Å or greater, about 3500 Å or greater, about 4000 Å or greater, or about 5000 Å or greater.

The conductive layer BSM may have two or more steps at an edge portion B thereof. The conductive layer BSM has two or more steps in order to allow the conductive layer BSM to have a thickness of about 800 Å or greater, e.g., 1500 Å or greater, and at the same time, to prevent cracks or disconnection in the inorganic layer and the semiconductor layer A of the auxiliary thin film transistor TFTa on the conductive layer BSM due to the step between layers. Therefore, in an exemplary embodiment of the present invention, thicknesses T11 and T12 of respective steps in the conductive layer BSM may each be less than 800 Å. For example, when the thickness T1 of the conductive layer BSM is 1500 Å, the thickness T11 and the thickness T12 of the steps may each be 750 Å.

Figure 9:
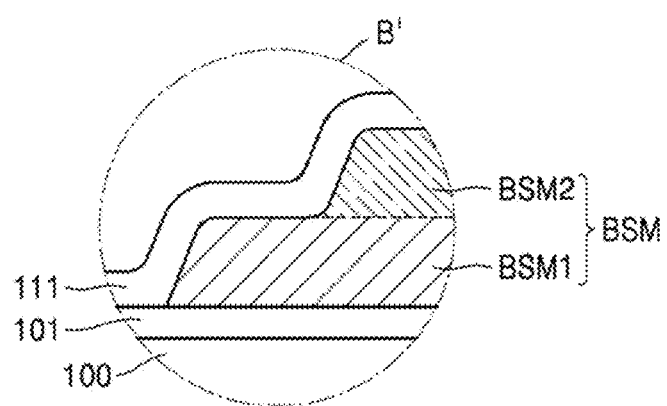

Referring to FIG. 9, according to an exemplary embodiment of the present invention, the conductive layer BSM may include a first conductive layer BSM1 and a second conductive layer BSM2 that are distinguished by the steps. The second conductive layer BSM2 may be on the first conductive layer BSM1. According to an exemplary embodiment of the present invention, the first conductive layer BSM1 and the second conductive layer BSM2 may have different conductive materials from each other. It may be appreciated that the first conductive layer BSM1 and the second conductive layer BSM2 having different conductive materials from each other include metal materials having different etch rates from each other.

The first conductive layer BSM1 includes a first conductive material, and the second conductive layer BSM2 includes a second conductive material. Here, the second conductive material at an upper layer may be a metal material having a greater etch rate than that of the first conductive material at a lower layer. The etch rate is a parameter indicated in a speed showing the amount of a film that may be removed for a predetermined time period via a same etchant. The etch rate is defined by Equation 1 below.

$$E/R = x/t \text{ (}x\text{: etched thickness, }t\text{: etching time, units: nm/min, nm/sec, or Å/min, Å/sec)} \quad \text{[Equation 1]}$$

To obtain the different etch rates of the conductive materials, the second conductive material at the second conductive layer BSM2 may have a Young's modulus that is less than that of the first conductive layer BSM1. Since a metal material having a small Young's modulus is likely to be deformed, a metal material having a relatively greater Young's rate may be selected as the first conductive layer BSM1 and a metal material having a relatively smaller Young's modulus may be selected as the second conductive layer BSM2. According to an exemplary embodiment of the present invention, the Young's modulus increases in an order of Al, Ti, Mo, and W, the first conductive layer BSM1 and the second conductive layer BSM2 may be obtained by using a combination of the stated metal materials. For example, when the first conductive layer BSM1 includes Mo, the second conductive layer BSM2 may include Al.

According to an exemplary embodiment of the present invention, the conductive layer BSM may be formed by a wet etching or a dry etching process. According to an exemplary embodiment of the present invention, when dry etching is used, an appropriate mixed gas may be used taking into account characteristics of the second conductive material in order to increase the etch rate of the second conductive layer BSM2 at the upper layer. In this case, even when the metal material having a relatively greater Young's modulus is located at the lower layer, the stepped structure of the conductive layer BSM may be obtained by applying an appropriate etch gas. For example, when $SF_6$ (80 sccm) is used as the etch gas, the first conductive layer BSM1 at the lower layer includes Ti, and the second conductive layer BSM2 at the upper layer includes W, the stepped structure of the conductive layer BSM may be obtained because the etch rate of W is greater than that of Ti.

According to an exemplary embodiment of the present invention, when the first conductive layer BSM1 includes Ti, the second conductive layer BSM2 may include Al. In this case, a modified etch gas may be used if necessary.

Figure 10:
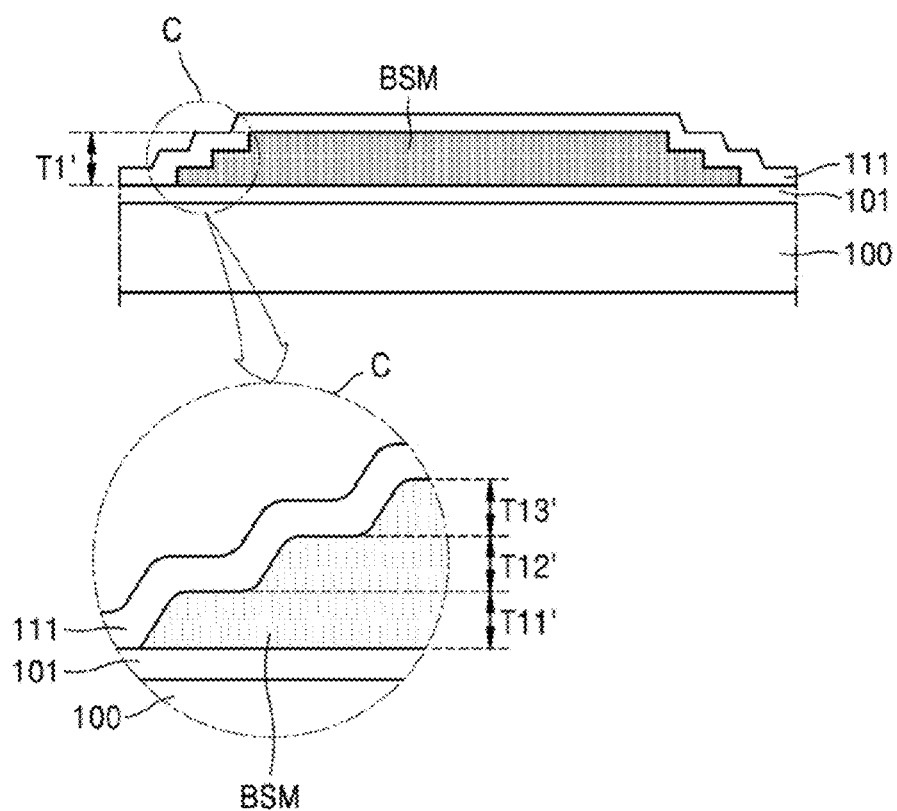

Referring to FIG. 10, in the conductive layer BSM, a width of a third conductive layer BSM3 in the first direction (e.g., the x direction) may be less than a width of the second conductive layer BSM2.

Referring to FIG. 10, the display panel of FIG. 10 may include the conductive layer BSM having three or more steps. The conductive layer BSM may be between the substrate 100 and the buffer layer 111, and the semiconductor layer A of the thin film transistor may be on the buffer layer 111 as shown in FIG. 7.

A thickness T1' of the conductive layer BSM may be about 800 Å or greater, for example, about 1500 Å or greater. According to an exemplary embodiment of the present invention, the thickness T1' of the conductive layer BSM may be about 2000 Å or greater, about 2500 Å or greater, about 3000 Å or greater, about 3500 Å or greater, about 4000 Å or greater, or about 5000 Å or greater.

The conductive layer BSM may have three or more steps at an edge portion C thereof. The conductive layer BSM has three or more steps in order to allow the conductive layer BSM to have a thickness of about 800 Å or greater, e.g., 1500 Å or greater, and at the same time, to prevent cracks or disconnection in the inorganic layer and the semiconductor layer of the auxiliary thin film transistor TFTa on the conductive layer BSM due to the step between layers. Therefore, thicknesses T11', T12', and T13' of respective steps in the conductive layer BSM may each be less than 800 Å. For example, when the thickness T1' of the conductive layer BSM is 1500 Å, the thickness T11', the thickness T12', and the thickness T13' of the steps may each be 500 Å. However, the present invention is not limited thereto. For example, the thicknesses T11', T12' and T13' may be unequal.

Figure 11:
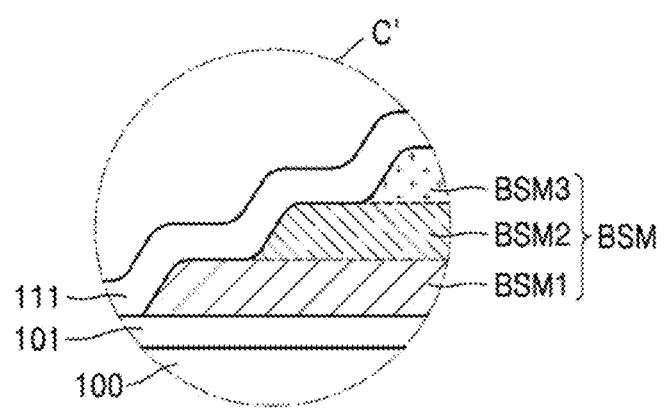

Referring to FIG. 11, according to an exemplary embodiment of the present invention, the conductive layer BSM may include the first conductive layer BSM1, the second conductive layer BSM2, and the third conductive layer BSM3 that are distinguished by the steps. The second conductive layer BSM2 may be on the first conductive layer BSM1, and the third conductive layer BSM3 may be on the second conductive layer BSM2.

According to an exemplary embodiment of the present invention, the first to third conductive layers BSM1, BSM2, and BSM3 may have different conductive materials from one another. It may be appreciated that the first to third conductive layers BSM1, BSM2, and BSM3 having different conductive materials from one another have metal materials having different etch rates from one another.

For example, the first conductive layer BSM1 includes a first conductive material, the second conductive layer BSM2 includes a second conductive material, and the third conductive layer BSM3 includes a third conductive material. Here, the third conductive material at an uppermost layer may be a metal material having a greater etch rate than that of the second conductive material, and the second conductive material may be a metal material having a greater etch rate than that of the first conductive material. To obtain the different etch rates among the conductive materials, the Young's moduli of the conductive materials included in the conductive layer BSM may be reduced in an order of the first conductive material, the second conductive material, and the third conductive material. According to an exemplary embodiment of the present invention, when the first conductive layer BSM1 includes Mo, the second conductive layer BSM2 may include Ti and the third conductive layer BSM3 may include Al.

Referring to FIGS. 10 and 11, in the conductive layer BSM, a width of the third conductive layer BSM3 in a first direction (e.g., the x direction) may be less than a width of the second conductive layer BSM2 in the first direction (e.g., the x direction), and the width of the second conductive layer BSM2 in the first direction (e.g., the x direction) may be less than a width of the first conductive layer BSM1 in the first direction (e.g., the x direction).

Figure 12:
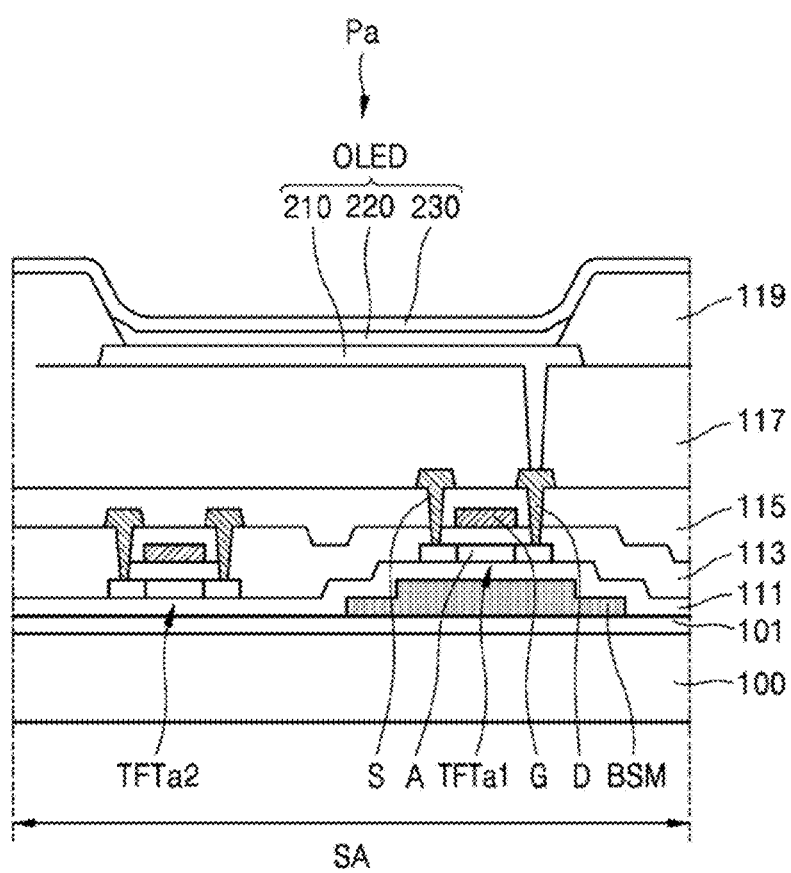
FIG. 12 is a cross-sectional view of a display panel according to an exemplary embodiment of the present invention.

FIG. 12 is a cross-sectional view showing a display panel according to an exemplary embodiment of the present invention. FIG. 12 shows a modified example of FIG. 7.

Referring to FIG. 12, the conductive layer BSM may be arranged overlapping only some of the thin film transistors of the auxiliary pixel Pa. For example, in FIG. 12, the conductive layer BSM is only arranged under the first auxiliary thin film transistor TFTa1 of the auxiliary pixel Pa, and may not be arranged under the second auxiliary thin film transistor TFTa2.

According to an exemplary embodiment of the present invention, the first auxiliary thin film transistor TFTa1 may be the driving thin film transistor T1 or the switching thin film transistor T2 of FIG. 4. According to an exemplary embodiment of the present invention, the first auxiliary thin film transistor TFTa1 may be the driving thin film transistor T1, the switching thin film transistor T2, the compensation thin film transistor T3, the first initialization thin film transistor T4, the operation control thin film transistor T5, the emission control thin film transistor T6, or the second initialization thin film transistor T7 of FIG. 5.

Figure 13:
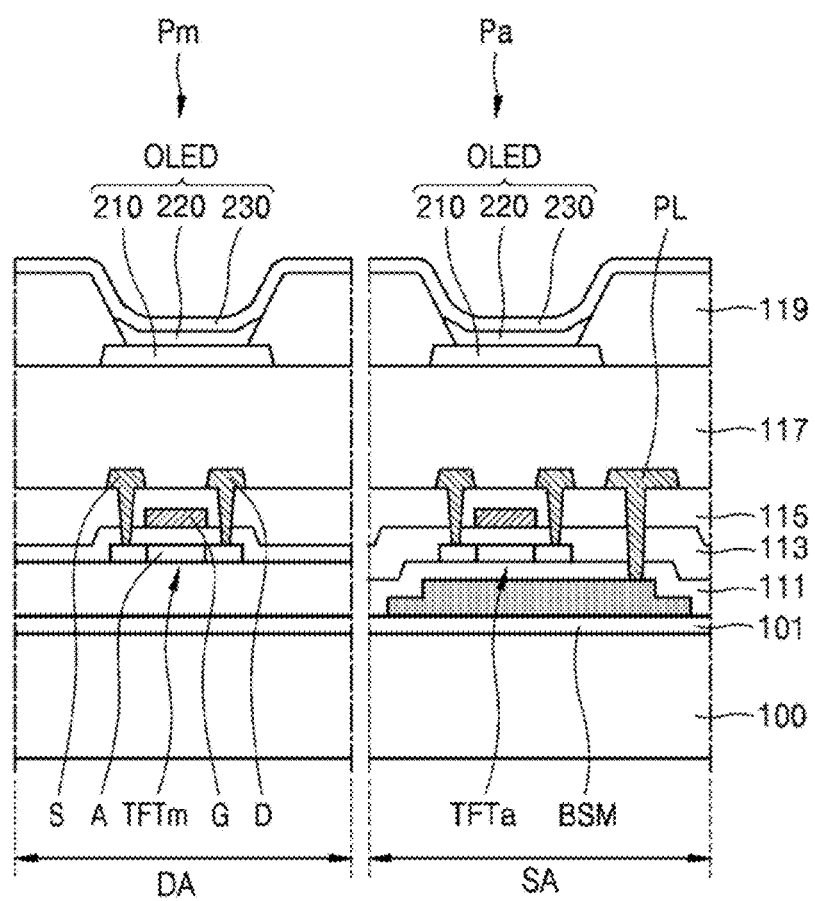
FIGS. 13 and 14 are cross-sectional views of display panels according to exemplary embodiments of the present invention.
Figure 14:
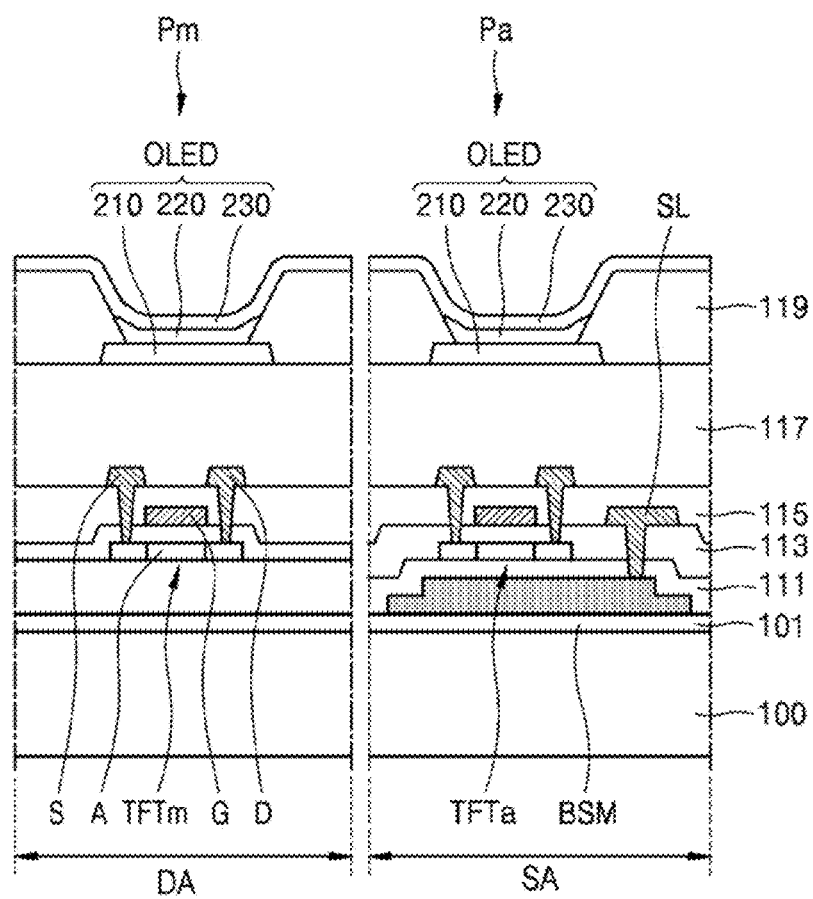

FIGS. 13 and 14 are cross-sectional views showing display panels according to exemplary embodiments of the present invention.

FIGS. 13 and 14 show the main pixel Pm in the display area DA and the auxiliary pixel Pa in the sensor area SA. As described above, the conductive layer BSM may be under the auxiliary pixel Pa. The conductive layer BSM may be under the main pixel Pm.

In addition, a constant voltage or a signal is applied to the conductive layer BSM to prevent damage to a pixel circuit due to an electrostatic discharge. As shown in FIG. 13 or FIG. 14, the conductive layer BSM may electrically contact the wiring that is connected to the auxiliary pixel Pa to apply electric power or signals thereto, so that a constant voltage or a signal may be applied to the conductive layer BSM.

Referring to FIG. 13, the conductive layer BSM may be electrically connected to the driving voltage line PL via a contact hole in the sensor area SA so that the constant voltage is applied thereto. The driving voltage line PL includes the same material as those of the source electrode S and/or the drain electrode D of the auxiliary thin film transistor TFTa, but is not limited thereto.

According to an exemplary embodiment of the present invention, the conductive layer BSM may be electrically connected to the scan line SL via the contact hole in the sensor area SA so that a signal is applied thereto, as shown in FIG. 14. The scan line SL includes the same material as that of the gate electrode G of the auxiliary thin film transistor TFTa, but is not limited thereto.

In the drawings, according to an exemplary embodiment of the present invention, the conductive layer BSM may be electrically connected to a driving voltage connecting line extending to the non-display area NDA via a contact hole defined in the non-display area NDA (see FIG. 3) on the outside of the display area DA. According to an exemplary embodiment of the present invention, the conductive layer BSM may be electrically connected to a scan connecting line extending to the non-display area NDA via the contact hole defined in the non-display area NDA so that a signal is applied thereto.

Figure 15:
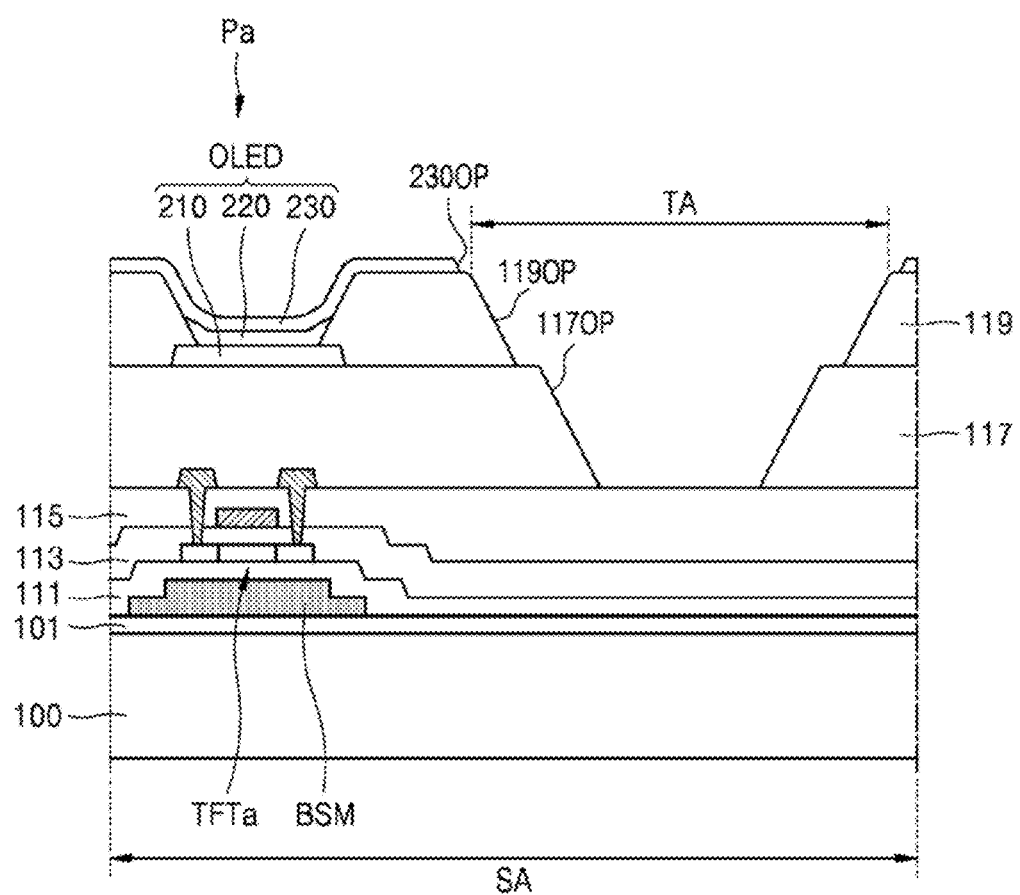
FIG. 15 is a cross-sectional view of a display panel according to an exemplary embodiment of the present invention.

FIG. 15 is a cross-sectional view showing a display panel according to an exemplary embodiment of the present invention.

Referring to FIG. 15, the sensor area SA includes the transmission portion TA. The planarization layer 117 may include a first transmission opening 1170P, the pixel defining layer 119 may include a second transmission opening 1190P, and the opposite electrode 230 may include a third transmission opening 2300P to correspond to the transmission portion TA. Accordingly, in the transmission portion TA, the buffer layer 111, the gate insulating layer 113, and the interlayer insulating layer 115 may overlap the substrate 100 in the third direction (e.g., the Z direction).

According to an exemplary embodiment of the present invention, the opposite electrode 230 may not include the third transmission opening 2300P, but may be arranged on the transmission portion TA. However, in this case, the transmittance of the transmission portion TA may degrade due to the opposite electrode 230 that is a metal layer, and thus, the opposite electrode 230 corresponding to the transmission portion TA may be removed.

According to an exemplary embodiment of the present invention, inorganic insulating layers, for example, the buffer layer 111, the gate insulating layer 113, and the interlayer insulating layer 115, may be all removed to correspond to the transmission portion TA. As described above, the layers may be removed in a region corresponding to the transmission portion TA to increase the transmittance of the transmission portion TA.

In addition, in the transmission portion TA, organic layers of the intermediate layer 220 formed on the entire surface of the substrate 100, e.g., a hole transport layer, a hole injection layer, an electron transport layer, an electron injection layer, etc. may be further arranged between the interlayer insulating layer 115 and the opposite electrode 230. Also, the thin film encapsulation layer 300 or a sealing substrate described above with reference to FIG. 2 may be also arranged on the opposite electrode 230.

According to the exemplary embodiments of the present invention, the display apparatus provided herein has an expanded display area for displaying images on the sensor area.

Accordingly, the display apparatus has increased image quality while performing various functions may be provided.

It should be understood that embodiments described herein should be considered in a descriptive sense only and not for purposes of limitation.

While exemplary embodiments have been described with reference to the figures, it will be understood by those of ordinary skill in the art that various changes in form and details may be made therein without departing from the spirit and scope of the present invention as defined by the following claims.

What is claimed is:

1. A display panel, comprising:
a substrate comprising a display area comprising first pixel and a sensor area comprising a second pixel and a transmission portion;
a display element layer on the substrate, the display element layer, comprising the first pixel electrically connected to a first thin film transistor and the second pixel electrically connected to a second thin film transistor; and
a conductive layer between the second thin film transistor and the substrate, the conductive layer having two or more steps at an edge thereof such that the edge of the conductive layer has a stair shape.

2. The display panel of claim 1, wherein the display element layer further comprises a scan line extending in a first direction, the scan line for providing a scan signal to the second pixel, and
the conductive layer is electrically connected to the scan line via a contact hole.

3. The display panel of claim 1, wherein the display element layer further comprises a driving voltage line extending in a second direction, the driving voltage line for applying a driving voltage to the second pixel, and
the conductive layer is electrically connected to the driving voltage line via a contact hole.

4. The display panel of claim 1, wherein the conductive layer leas a thickness of 1500 Å or greater.

5. The display panel of claim 1, wherein one of the two or more steps in the conductive layer has a thickness less than 800 Å.

6. The display panel of claim 1, wherein the conductive layer comprises a first conductive layer and a second conductive layer on the first conductive layer, and
the first conductive layer and the second conductive layer include different materials from each other.

7. The display panel of claim 6, wherein the first conductive layer comprises a first conductive material and the second conductive layer comprises a second conductive material having an etch rate greater than an etch rate of the first conductive material.

8. The display panel of claim 6, wherein a width of the second conductive layer in a first direction is less than a width of the first conductive layer.

9. The display panel of claim 1, wherein a thickness of the edge of the conductive layer is less than a thickness of a center portion of the conductive layer.

10. The display panel of claim 1, wherein the sensor area comprises an auxiliary pixel area and a transmission area, the auxiliary pixel area having the second pixel and the transmission area comprising the transmission portion, and
the auxiliary pixel area and the transmission area are arranged in a grid shape.

11. The display panel of claim 10, wherein the at least one second pixel comprises a pixel electrode, a common electrode, and an intermediate layer, the common electrode facing the pixel electrode and the intermediate layer being arranged between the pixel electrode and the common electrode, and
the common electrode comprises an opening corresponding to the transmission area.

12. The display panel of claim 1, wherein an image provided on the sensor area has a resolution that is less than a resolution of an image provided on the display area.

13. A display apparatus, comprising:
- a substrate comprising a display area comprising a first pixel, and a sensor area comprising a second pixel and a transmission portion;
- a display element layer on the substrate, the display element layer comprising the first pixel electrically connected to a first thin film transistor and the second pixel electrically connected to a second thin film transistor;
- a conductive layer between the second thin film transistor and the substrate, the conductive layer having two or more steps formed as a stair shape; and
- a component arranged under the substrate in the sensor area.

14. The display apparatus of claim 13, wherein the component comprises an electronic element for emitting or receiving light.

15. The display apparatus of claim 13, wherein the display element layer further comprises a scan line and a driving voltage line, the scan line extending in a first direction and for providing a scan signal to the second pixel and the driving voltage line extending in a second direction that intersects with the first direction and for applying a driving voltage to the second pixels, and
- the conductive layer is electrically connected to the scan line or the driving voltage line via a contact hole.

16. The display apparatus of claim 13, wherein the conductive layer has a thickness of 1500 Å or greater.

17. The display apparatus of claim 13, wherein the two or more steps in the conductive layer each have a thickness less than 800 Å.

18. The display apparatus of claim 13, wherein the conductive layer comprises a first conductive layer and a second conductive layer on the first conductive layer, and
- the first conductive layer and the second conductive layer include different materials from each other.

19. The display apparatus of claim 18, wherein the first conductive layer comprises a first conductive material and the second conductive layer comprises a second conductive material having an etch rate greater than an etch rate of the first conductive material.

20. The display apparatus of claim 18, wherein an image provided on the sensor area has a resolution that is less than a resolution of an image provided on the display area.

21. A display apparatus, comprising:
- a substrate including a display area;
- a first pixel and a sensor area disposed in the display area, the sensor area comprising a second pixel and a transmission portion;
- a sensing component overlapping the second pixel and the transmission portion; and
- a conductive layer disposed between the sensing component and the second pixel, the conductive layer being connected to a scan line or a driving voltage line.

* * * * *